United States Patent
Basol

(10) Patent No.: US 8,415,559 B2
(45) Date of Patent: *Apr. 9, 2013

(54) METHOD FOR FORMING COPPER INDIUM GALLIUM CHALCOGENIDE LAYER WITH SHAPED GALLIUM PROFILE

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 23 days.

This patent is subject to a terminal disclaimer.

(21) Appl. No.: 12/414,029

(22) Filed: Mar. 30, 2009

(65) Prior Publication Data

US 2009/0226717 A1    Sep. 10, 2009

Related U.S. Application Data

(63) Continuation-in-part of application No. 12/028,752, filed on Feb. 8, 2008, now Pat. No. 8,252,621.

(51) Int. Cl.
*H01L 31/00* (2006.01)

(52) U.S. Cl. .......... 136/265; 136/262; 136/264; 438/57; 438/93; 438/95

(58) Field of Classification Search ............... 136/261, 136/264, 265; 438/57, 93, 95
See application file for complete search history.

(56) References Cited

U.S. PATENT DOCUMENTS

| | | |
|---|---|---|
| 4,581,108 A | 4/1986 | Kapur et al. |
| 4,798,660 A | 1/1989 | Ermer et al. |
| 6,048,442 A | 4/2000 | Kushiya et al. |
| 6,092,669 A | 7/2000 | Kushiya et al. |
| 6,258,620 B1 * | 7/2001 | Morel et al. ............ 438/57 |
| 6,323,417 B1 * | 11/2001 | Gillespie et al. ........... 136/262 |
| 6,441,301 B1 | 8/2002 | Satoah |
| 2006/0207644 A1 * | 9/2006 | Robinson et al. ........... 136/243 |
| 2007/0163639 A1 * | 7/2007 | Robinson et al. ........... 136/262 |

OTHER PUBLICATIONS

Alberts, et al., "X-Ray Fluorescene Investigatio of the GaDistribution in Cu(In,Ga)Se2 Thin Films", *Solar Energy Mats. and Solar Cells*, vol. 64, 2000, pp. 371-.
Basol, B., et al., "Studies on Sulfur Diffusion into Cu(In,Ga)Se2 Thin Films", *Progress in Photovoltaics*, vol. 8, 2000, pp. 227-235.
Basol, B., et al., "Cu(In,Ga)Se2 Thin Films and Solar Cells Prepared by Selenization of Metallic Precursors", *J. Vac. Sci. Technol.*, A.14(4), Jul./Aug. 1996, pp. 2251-2256.
Delsol, et al., "Experimental Study of Graded Bandgap Cu(InGa)(SeS)2 Thin Films Grown on Glass/Molybdenum Substrates by Selemization and Sulphidation", *Solar Energy Mats and Solar Cells*, vol. 82, 2004, pp. 587-.

(Continued)

*Primary Examiner* — Jonathan Johnson
*Assistant Examiner* — Thanh-Truc Trinh
(74) *Attorney, Agent, or Firm* — Pillsbury Winthrop Shaw Pittman LLP

(57) ABSTRACT

Precursor layers and methods of forming Group IBIIIAVIA solar cell absorbers with bandgap grading using such precursor layers are described. The Group IBIIIAVIA absorber includes a top surface with a Ga/(Ga+In) molar ratio in the range of 0.1-0.3. The Group IBIIIAVIA solar cell absorber is formed by reacting the layers of a multilayer material structure which includes a metallic film including Cu, In and Ga formed on a base, a layer of Se formed on the metallic film, and a second metallic layer substantially including Ga formed on the layer of Se.

4 Claims, 4 Drawing Sheets

OTHER PUBLICATIONS

Dhere, et al., "Gallium Content Enhancement in CuIn1-xGaxSe2 Thin Films Prepared by Two-Selenizations Process Using Se Vapor", $25^{th}$ *PVSC*, May 13-17, 1996, Washington CD, pp. 897-900.

Gabor, A., et a., "CuInSe2 Thin Film Formation by Rapid Annealing of the elemental Precursor" *AIP Conf. Proc.*, vol. 268, 1992, pp. 236-.

Karg, F., et al., "Novel Rapid-Thermal-Processing for CIS Thin Film Solar Cells", *Proc. of IEEE Photovoltaic Specialists Conf.*, 1993, pp. 441-446.

Lundberg, et al., "Diffusion of Indium and Gallium in Cu(In, Ga)Se2 Thin Film Solar Cells", *J. of Physics and Chem of Solids*, vol. 64, 2003, pp. 1499-1504.

Marudachalam, et al., "Phases, Morphology, and Diffusion in CuInxGa1-xSe2 Thin Films", *J. Appl. Phys.*, vol. 82, 1997, pp. 2896-.

Mooney, G., et al., "The Formation of CuInSe2 Thin Films by Rapid Thermal Processing", *Solar Cells*, vol. 30, 1991, pp. 69-.

Nakagawa, et al., "Development of Cu(In,Ga)Se2 Thin Film Solar Cells by Encapsulated Selenization", i $14^{th}$ *European Photovoltaic Solar Energy Conference*, 1997, pp. 1216-1219.

Palm, et al., "Cu(In,Ga)(Se,S)2 Absorbers Formed by Rapid Thermal Processing of Elemental Precursors", *MRS Proc.*, vol. 763, 2003, pp. 275-280.

Ramanathan, et al., "Properties of 19.2% Efficiency ZnO/CdS/ CuInGaSe2 Thin Film Solar Cells", *Progress in Photovoltaics*, vol. 11, 2003, pp. 225-230.

Klenk, et al., "Material Properties of CuGaSe2 Absorber Films Prepared by Rapid Thermal Annealing of Stacked Elemental Layers", *J. Phys .D: Appl. Phys.*, vol. 36, 2000, pp. 2531-2537.

\* cited by examiner

METHOD FOR FORMING COPPER INDIUM GALLIUM CHALCOGENIDE LAYER WITH SHAPED GALLIUM PROFILE

CROSS-REFERENCE TO RELATED APPLICATIONS

This application claims priority to and is a Continuation in Part of U.S. patent application Ser. No. 12/028,752 filed Feb. 8, 2008 entitled "METHOD FOR FORMING COPPER INDIUM GALLIUM CHALCOGENIDE LAYER WITH OPTIMIZED GALLIUM CONTENT AT ITS SURFACE", which and is incorporated herein by reference in its entirety.

FIELD OF THE INVENTION

The present invention relates to method and apparatus for preparing thin films of semiconductor films for radiation detector and photovoltaic applications.

BACKGROUND

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors that contain Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or Cu(In,Ga)(S,Se)$_2$ or CuIn$_{1-x}$Ga$_x$(S$_y$Se$_{1-y}$)$_k$, where $0\leq x\leq 1$, $0\leq y\leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications. It should be noted that although the chemical formula for CIGS(S) is often written as Cu(In,Ga)(S,Se)$_2$, a more accurate formula for the compound is Cu(In,Ga)(S,Se)$_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, Cu(In,Ga)(S,Se)$_2$ means the whole family of compounds with Ga/(Ga+In) molar ratio varying from 0 to 1, and Se/(Se+S) molar ratio varying from 0 to 1.

The structure of a conventional Group IBIIIAVIA compound photovoltaic cell such as a Cu(In,Ga,Al)(S,Se,Te)$_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of Cu(In,Ga,Al)(S,Se,Te)$_2$, is grown over a conductive layer 13 or contact layer, which is previously deposited on the substrate 11 and which acts as the electrical contact to the device. The substrate 11 and the conductive layer 13 form a base 13A on which the absorber film 12 is formed. Various conductive layers that include Mo, Ta, W, Ti, and their nitrides etc. have been used in the solar cell structure of FIG. 1. If the substrate itself is a properly selected conductive material, it is possible not to use the conductive layer 13, since the substrate 11 may then be used as the ohmic contact to the device. After the absorber film 12 is grown, a transparent layer 14 such as a CdS, ZnO, CdS/ZnO or CdS/ZnO/ITO etc. stack is formed on the absorber film 12. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the Cu(In,Ga,Al)(S,Se,Te)$_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a Cu(In,Ga)(S,Se)$_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. So far experimental results have shown that a Ga/(Ga+In) ratio of about 0.2-0.3 at the junction area (top 0-1 to 0.3 µm of the CIGS surface) yields the highest efficiency solar cells. When this ratio increases further, the device efficiency gets reduced. Although the reasons for this are not fully understood, it is reported that the electronic quality of CIGS material gets worse as the Ga/(Ga+In) ratio increases beyond 0.3. It is important for a thin film deposition process to have the capability of controlling both the molar ratio of IB/IIIA, and the molar ratios of the Group IIIA components in the composition.

One attractive technique for growing Cu(In,Ga)(S,Se)$_2$ or CIGS(S) type compound thin films for solar cell applications is a two-stage process where metallic components of the Cu(In,Ga)(S,Se)$_2$ material are first deposited onto a substrate during the first stage of the process, and then reacted with S and/or Se in a high temperature annealing process during the second stage. Sputtering and evaporation techniques have been used in prior art approaches to deposit the layers containing the Group IB and Group IIIA components of the precursor stacks during the first stage of such a process. In the case of CuInSe$_2$ growth, for example, Cu and In layers were sequentially sputter-deposited on a substrate and then the stacked film was heated in the presence of gas containing Se at elevated temperature for times typically longer than about 30 minutes, as described in U.S. Pat. No. 4,798,660. More recently U.S. Pat. No. 6,048,442 disclosed a method of sputter-depositing a stacked precursor film that includes a Cu—Ga alloy layer and an In layer to form a Cu—Ga/In stack on a metallic back electrode layer and then reacting this precursor stack film with one of Se and S to form the absorber layer. U.S. Pat. No. 6,092,669 described sputtering-based equipment for producing such absorber layers. According to a method described in U.S. Pat. No. 4,581,108, a Cu layer is first electrodeposited on a substrate; this is then followed by electrodeposition of an In layer and heating of the deposited Cu/In stack in a reactive atmosphere containing Se to form $CuInSe_2$ or CIS.

Heating of metallic precursors to form CIS or CIGS(S) type layers may be carried out in various ways. Some groups use standard furnace processing to heat the layers slowly (such as at a rate of 1° C./second) to the reaction temperature of 400-500° C. in presence of Se and/or S. This furnace type processes generally use a gas as the source of Group VIA material. For example, $H_2Se$ and $H_2S$ are commonly used to react precursors that include Cu and In, to form CIS layers. The reaction time in such a process is usually in the range of 0.5-2 hours. For precursors that also contain a Group VIA material (such as a base/Cu/In/Se stack) a rapid thermal processing (RTP) process with a temperature rise rate of at least 10° C./second is preferred as the temperature passes through the melting point of Se (about 220° C.), because reportedly such a high rise rate of temperature around the Se melting point avoids the formation of defects on the surface of the film which may result from de-wetting of the surface by the molten Se if too much time is allowed for Se to melt and form "balls" on the surface due to surface tension. Such defects are known to yield inhomogeneous film morphology, poor adhesion of the CIS layer and low solar cell efficiency. It is stated that such problems may be avoided by passing through the critical temperature range between 80° C. and 300° C. at a temperature rise rate of about 10° C./sec by using RTP (see for example, F. Karg et al., Proceedings of IEEE Photovoltaic Specialists Conf. 1993, page:441). High rate RTP has been used by others also to form CIS layers (see for example, A. Gabor et al., AIP Conference Proceedings 268, 1992, page. 236, and G. Mooney et al., Solar Cells, vol: 30, page:69, 1991). Although various rise rates for temperature were evaluated in these early studies a rate of around 10° C./second was found to be best in terms of morphology of the resulting CIS films. In these early studies Ga was not added to the absorber to form CIGS.

Although CIS formation using two-stage processes employing slow annealing using a gaseous Se source or fast annealing using a Se layer deposited on a Cu/In precursor is rather straight forward, complications arise when Ga is added to the precursor to form a CIGS absorber. Curve A in FIG. 2 schematically shows a typical distribution profile for the Ga/(Ga+In) molar ratio for a $Cu(In,Ga)Se_2$ absorber layer formed by a two-stage process involving selenization of metallic precursors including Cu, In and Ga. As can be seen from this figure, one problem faced with the selenization type processes or two-stage processes to grow CIGS is the difficulty of distributing Ga uniformly through the thickness of the absorber layer formed after the reaction of the Cu, In and Ga containing metallic precursor film with Se. It is believed that when a metallic precursor film including Cu, In and Ga is deposited first on a contact layer (such as Mo) of a base and then reacted with Se, the Ga-rich phases segregate to the film/base interface (or the film/contact layer interface) because reactions between Ga-bearing species and Se are slower than the reactions between In-bearing species and Se. Therefore, such a process yields compound absorber layers with surfaces that are rich in In and poor in Ga. Various reports in the literature have described this phenomenon (see for example, Basol et al., Progress in Photovoltaics, vol. 8 (2000) p. 227, Alberts et al., Solar Energy Materials and Solar Cells, vol. 64 (2000) p. 371, Marudachalam et al., J. Appl Phys., vol. 82 (1997) p. 2896, Delsol et al., Solar Energy Materials and Solar Cells, vol. 82 (2004) p. 587). Furthermore, such Ga grading is observed even when a RTP process is used to react precursor layers including Cu, In, Ga and Se (see for example, J. Palm et al., MRS Proceedings vol: 763, page B6.8.1, 2003). It is for this reason that, as can be seen in some of the references cited above, increasing the bandgap value of the absorber near its surface region is usually achieved by first obtaining a CIGS layer with a Ga poor surface (such as shown in FIG. 2 Curve A) and then reacting this layer with sulfur (S) at high temperature so that the Ga-poor, In-rich surface layer is converted into a high bandgap sulfide material as shown by the S profile curve B in FIG. 2. In this case the absorber layer is a CIGS(S) layer containing both S and Se.

When a solar cell is fabricated on an absorber layer with Ga gradation such as the one shown in FIG. 2, Curve A, the active junction of the device is formed within the absorber surface region with a low Ga/(Ga+In) ratio, which is near-zero for Curve A. This surface portion or region, therefore, is practically a CIS or $CuInSe_2$ layer with a small bandgap and consequently solar cells fabricated on such layers display low open circuit voltages (typically in the range of 400-500 mV) and thus lower efficiencies. It should be noted that the bandgap values for $CuInSe_2$ and $CuGaSe_2$ are around 1.0 eV and 1.7 eV, respectively and by adjusting the amount of Ga in CIGS, the bandgap may be tuned to any value between these two values. Relatively uniform Ga distribution through a CIGS layer may be readily obtained by a technique such as co-evaporation. Solar cells fabricated on such absorbers display higher voltage values of typically over 600 mV due to the presence of Ga (typically 20-30%) near the surface region. The world-record-holding CIGS solar cell with over 19% conversion efficiency was demonstrated on such an absorber obtained by a co-evaporation process (see, for example Ramanathan et al., Progress in Photovoltaics, vol. 11 (2003) p. 225). Obtaining Ga distribution profiles with more Ga near the surface region for absorbers formed by low cost two-stage processes is important to increase the performance of such absorbers. Several attempts were made to investigate the possibility of controlling Ga distribution within absorbers grown by the two-stage processes. Marudachalam et al. (J. Appl. Phys., vol. 82 (1997) p. 2896), for example, annealed the already formed CIGS layers at high temperatures to diffuse Ga to the surface from the back side of the absorber. Nakagawa et al. (14th European Photovoltaic Solar Energy Conf., 1997, p. 1216) prepared CIGS layers using various precursor stacks of In—Se/Cu/Ga—Se, In—Se/Ga—Se/Cu, Cu/In—Se/Ga—Se, Cu/Ga—Se/In—Se, Ga—Se/Cu/In—Se, Ga—Se/In—Se/Cu, In—Se/Ga—Se/Cu/Ga—Se, Ga—Se/In—Se/Cu/Ga—Se, and Ga—Se/In—Se/Ga—Se/Cu. As can be seen from this list, the prior art attempts used precursor stacks including compounds or selenides such as gallium selenide (Ga—Se) and indium selenide (In—Se) in attempts to distribute Ga in various ways in the stack. These indium selenide and gallium selenide phases are phases with high melting temperatures of above 600° C. CIGS formation by two-stage process takes place at temperatures below 600° C., typically at around 450-575° C. Therefore, metallic precursors having low temperature melting phases (such as In and Ga metals and metallic alloys such as In—Ga, Cu—Ca, Cu—In and Cu—In—Ga), with melting points below 600° C., may be preferred since they may facilitate liquid phase assisted growth which yields large grain growth.

As the brief discussion above demonstrates there is still a need to develop a two-stage approach that can utilize precursor layers substantially including metallic ingredients and still provide CIGS absorber layers with a Ga/(Ga+In) molar ratio in the range of 0.1-0.3 near its surface region, i.e. within the top 0.1-0.3 um of the absorber layer.

SUMMARY

In one embodiment, the present invention provides a method of forming a Group IBIIIAVIA solar cell absorber, which includes a surface region of less than or equal to 300 nm depth, a bulk region which may be thicker than 400 nm and a transition region between the surface region and the bulk region. The Ga/(Ga+In) molar ratio within the surface region is in the range of 0.1-0.3. The Ga/(Ga+In) molar ratio in the transition region is lower than the Ga/(Ga+In) molar ratios in the surface region and the bulk region. The Group IBIIIAVIA solar cell absorber is formed by reacting the layers of a multilayer material structure which includes a first metallic film including Cu, In and Ga formed on a base, and a second film formed on the first metallic film, the second film comprising Se and Ga, substantially in their elemental forms.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION

Present inventions use specific precursor layer structures and specific heating means to grow a $Cu(In,Ga)Se_2$ or CIGS absorber layer with a Ga/(Ga+In) ratio of 0.1-0.3 within the top 0.3 um portion of the absorber. This way, when a junction is formed on the top portion of the absorber, highly efficient solar cells with open circuit values exceeding 600 mV can be fabricated without the use of sulfur (S). The present inventions also teach techniques to shape the profile or distribution of Ga near the surface region of the absorber layer.

Figure 3:
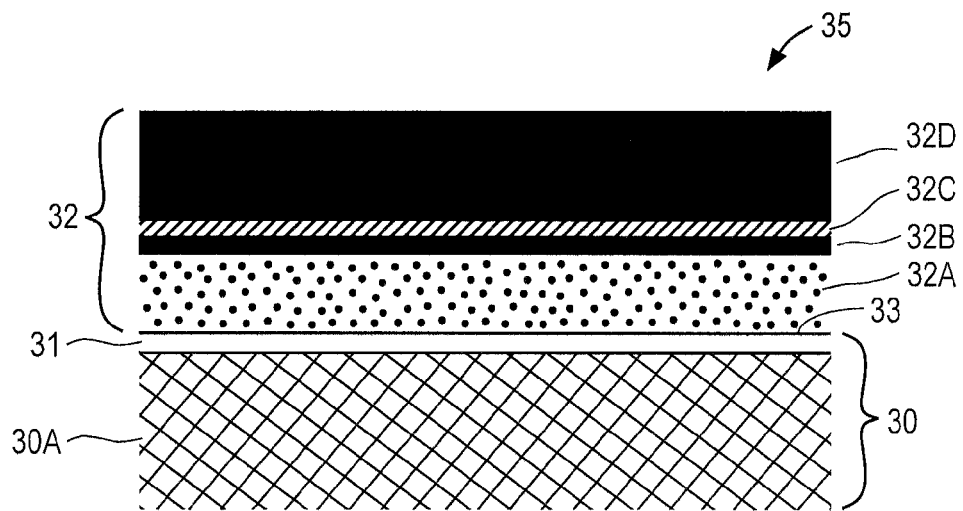
FIG. 3 is a precursor structure according to an embodiment of the present invention.

FIG. 3 schematically shows a structure 35 including a precursor layer 32 formed on a base 30 in accordance with the present invention. The base 30 comprises a substrate 30A and a contact layer 31. The substrate 30A may be an insulating sheet or foil such as glass or polyimide or a conductive sheet or foil such as stainless steel or aluminum alloy web. The contact layer 31 may comprise a conducting material such as Mo, Ta, Ru, Ir and Os among others. The precursor layer 32 is grown on the top surface 33 of the contact layer 31. The precursor layer 32 comprises three portions.

The first portion 32A is next to the contact layer 31 and it comprises a metallic film having metallic Cu, In and optionally Ga. This is the portion of the precursor 32 where most of the In and Cu are supplied from. The ingredients within the first portion 32A are metallic, either elemental or alloy form of Cu, In and optionally Ga so that during the reaction step CIGS film can grow with good microstructure and large grains. Accordingly the first portion 32A may comprise stacks containing Cu, In and Ga (for example Cu/In/Ga Cu/Ga/In, etc. stacks) or stacks of metallic alloys and elements (such as Cu—In/Cu—Ga, Cu—In/Ga, Cu—Ga/In, Cu—Ga/Cu—In, etc.). The first portion 32A may be deposited by various techniques such as evaporation, sputtering, ink or slurry deposition etc., however, the preferred method is electroplating. The thickness of the first portion 32A may be in the range of 400-2000 nm, preferably in the range of 500-1000 nm. The Cu1/(In1+Ga1) molar ratio in the first portion 32A may be in the range of 0.7-1.2, preferably in the range of 0.8-1.0. In this equation Cu1, In1 and Ga1 represent the number of moles of Cu, In and Ga, respectively, within the first portion 32A. The In1/T1 molar ratio may be in the range of 0.25-0.6, where T1 represents the total number of moles of all elements within the first portion 32A, i.e. T1 comprises total number of moles of Cu, In, Ga and an additive material such as a dopant material including one of Na, K, Li and the like that may be present in the first portion 32A. It should be noted that there is no Group VIA material such as Se present in the first portion 32A.

The second portion 32B or separator layer substantially comprises a Group VIA material such as Se and Te with (VIA)2/T2 molar ratio being in the range of 0.95-1.0. In this equation (VIA)2 represents the number of moles of Group VIA materials and T2 represents the total number of moles of all elements within the second portion 32B. In other words, the second portion 32B is substantially made of a Group VIA material such as Se and Te, but it also may include up to about 5% mole of other elements or additive materials such as at least one of Cu, In, Ga, and a dopant material including one of Na, K, Li and the like. Preferably, the second portion comprises only a Group VIA material. The Group VIA material may be Se or Te or a mixture of Se and Te. The thickness of the second portion may be in the range of 50-1500 nm, preferably in the range of 100-1000 nm. Various approaches such as evaporation and ink or slurry deposition may be used to deposit the second portion 32B, but the preferred method is electroplating.

A third portion 32C or source layer is formed on the second portion 32B. The third portion 32C comprises Ga. For example, the third portion may be a film of Ga, or it may additionally contain small amounts of In and/or Cu. In any case the Ga3/T3 molar ratio within the third portion 32C may be in the range of 0.8-1.0, where Ga3 represents the number of moles of Ga and T3 represents the total number of moles of all elements such as Cu and In that may be present within the third portion 32C. The third portion 32C comprises mostly Ga and additive materials such as metallic elements of Cu and In and possibly dopants including one of Na, K, Li and the like. The thickness of the third portion 32C may be in the range of 10-200 nm, preferably in the range of 20-100 nm. The third portion 32C may be deposited using various thin film deposition methods such as evaporation, sputtering, ink deposition, etc., however, the preferred method is evaporation.

The fourth portion 32D or cap layer of the precursor layer 32 consists substantially of Se. This layer may be deposited using various techniques but the preferred method is evaporation. The thickness of the fourth portion 32D may be in the range of 500-5000 nm, preferably in the range of 800-3000 mm. The Se4/T4 molar ratio within the fourth portion 32D may be in the range of 0.95-1.0, where Se4 represents the number of moles of Se and T4 represents the total number of moles of all elements within the fourth portion 32D. In other words T4 includes other elements or additive materials that may be present in the fourth portion 32D such as Te and alkali metal dopant materials including one of Na, K, Li and the like.

Each portion described above has a function within the unique structure of the precursor layer 32 of the present invention. The first portion 32A is the source or provider of most of the Cu and In, and optionally Ga of the overall precursor layer 32. The second portion 32B is a separator between the first portion 32A and the third portion 32C and it provides a Group VIA material such as Se or Te to both the first portion 32A and the Ga-containing third portion 32C when the temperature of the precursor layer 32 is rapidly raised above 400° C. Such reaction of Se and/or Te with the Ga within the third portion 32C helps arrest Ga diffusion towards the contact layer 31 and keeps Ga close to the surface of the absorber after the reaction step. It should be noted that even if Te is included in the second portion 32B, the absorber film obtained after the heating and reaction of the precursor layer 32 would be substantially a CIGS layer since the thickness of the second portion 32B is much smaller than that of the fourth portion 32D which comprises mostly Se. Since Te is a Group VIA material like Se and since the bandgap of $CuInTe_2$ is very similar to the bandgap of $CuInSe_2$, inclusion of some Te in the CIGS layer does not negatively impact the quality of the resulting absorber layer.

As reviewed before, one of the prior art methods to form CIGS absorbers employed a Cu/In/Ga/Se precursor structure and rapid thermal processing to convert this precursor structure into a CIGS absorber. Resulting CIGS absorbers comprised segregated In-rich and Ga-rich sections (as in FIG. 2, Curve A) even though Ga was placed far away from the contact layer. The reason for this is the fact that when the temperature of such a precursor layer or stack is raised, Ga can react with the Se layer placed on top of it as well as with the In layer and the Cu layer placed under it. Gallium reaction and intermixing with In and Cu is faster than its reaction with Se. Therefore, it in effect moves towards the contact layer while In and Cu move towards the surface. In the present invention Group VIA-rich second portion 32B is placed under the Ga-containing third portion 32C so that this problem can be avoided and the Group VIA-rich second portion 32B acts as a barrier between the In-containing first portion 32A and the Ga-containing third portion 32C. If the metallic Ga of the third portion 32C were to be placed directly on top of the Cu and In containing first portion 32A, without placing the second portion 32B between the two portions, metallic Ga of the third portion 32C would easily mix in with the metallic Cu and In of the first portion 32A and move towards the contact layer 31 as explained above.

The fourth portion 32D provides the excess Se to the overall compound absorber formation process and at the same time, since it is in physical contact with the Ga-containing third portion 32C, it assists in reacting metallic Ga with Se and thus arrest its diffusion from the surface region of the absorber during the reaction. As the above discussion demonstrates, sandwiching the Ga-containing third portion 32C between Se and/or Te containing second portion 32B and Se containing fourth portion 32D helps keep Ga near the surface. Metallic Cu and In containing first portion 32A is relatively thick and it assists in forming a CIGS layer with a good microstructure and with large grains after the reaction. It should be noted that all portions of the precursor layer 32 are formed at relatively low temperatures, typically below 100° C., preferably below 50° C. This way, substantially discrete nature of each of the first portion 31A, the second portion 32B, the third portion 32C and the fourth portion 32D is preserved without much reaction between each portion. The reaction step is then carried out, preferably in a different apparatus, using RTP approach as will be described next. This is different from some prior art methods where various species of Cu, In, Ga and Se are deposited at various stages of the process on a heated substrate causing reaction and compound absorber formation during the film deposition step.

As stated before, it is believed that when a substantially metallic precursor film including metallic Cu, In and Ga is deposited first on a contact layer (such as Mo) of a base and then reacted with Se, the Ga-rich phases segregate to the film/base interface (or the film/contact layer interface) because reactions between Ga-bearing species and Se are slower than the reactions between In-bearing species and Se. Therefore, such a process yields compound absorber layers with surfaces that are rich in In and poor in Ga. There are reports in the literature (see, e.g. Wolf et al., Proceedings of $2^{nd}$ World Conference on PV Solar Energy Conversion, 6-10 Jul., 1998, p. 2426) stating that formation of In—Se and Cu—Se species take place at temperatures above 200° C. and formation of $CuInSe_2$ may initiate at around 300-350° C. when a metallic precursor layer containing Cu and In is reacted with Se. Formation of $CuGaSe_2$ phase, however, takes place above 450° C., typically at or above 500° C. There are also studies made on inter-diffusion of $CuInSe_2/CuGaSe_2$ bi-layers in absence and presence of an alkali metal such as Na. Results suggest that presence of Na reduces inter-diffusion between the In-rich and Ga-rich phases and promotes segregation of In-rich and Ga-rich phases through the thickness of the absorber layer. This represents a negative result for the prior art methods where segregation of Ga is a problem. On one hand an alkali metal such as Na is needed to lower the resistivity of the resulting compound layers and therefore Na is usually included in the precursor layers including Cu, In and Ga by deposition of a Na compound at the contact layer/precursor layer interface, but on the other hand, presence of Na encourages the formation of non-uniform Ga distribution shown in FIG. 2, Curve A. In the present invention, the above mentioned Na effect may be used to ones benefit. In that respect, instead of on the contact layer 31, Na may be included in at least one of the second portion 32B, the third portion 32C and the fourth portion 32D of the precursor layer 32. This can be achieved by depositing a discrete film (not shown) of a Na-containing material (such as Na, Na—Se, Na—S, Na—F, Na—I, etc.) within the stack defined by the second portion 32B, the third portion 32C and the fourth portion 32D.

Alternately a Na-containing material may be co-deposited along with at least one of the second portion 32B, the third portion 32C and the fourth portion 32D. In any case, the equivalent thickness of this Na-containing film may be in the range of 2-40 nm, preferably in the range of 5-20 nm. By including Na in at least one of the Ga and Se-rich portions, i.e. second, third and fourth portions, of the overall precursor layer 32, diffusion of the Ga species (which react with Se) down towards the contact layer 31 is reduced because of presence of Na within these Ga and Se-rich portions, and because of the above mentioned nature of Na retarding interdiffusion of Ga-rich and In-rich phases. It should be noted that inclusion of Na in the first portion 32A is optional in this case. It should also be noted that although Na is the preferred doping material, it may be wholly or partially replaced by another alkali metal such as K and Li.

Figure 1:
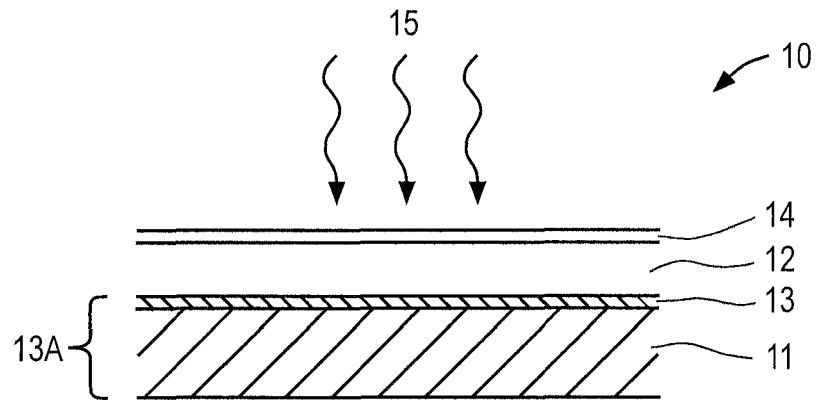
FIG. 1 is a cross-sectional view of a solar cell employing a Group IBIIIAVIA absorber layer.
Figure 2:
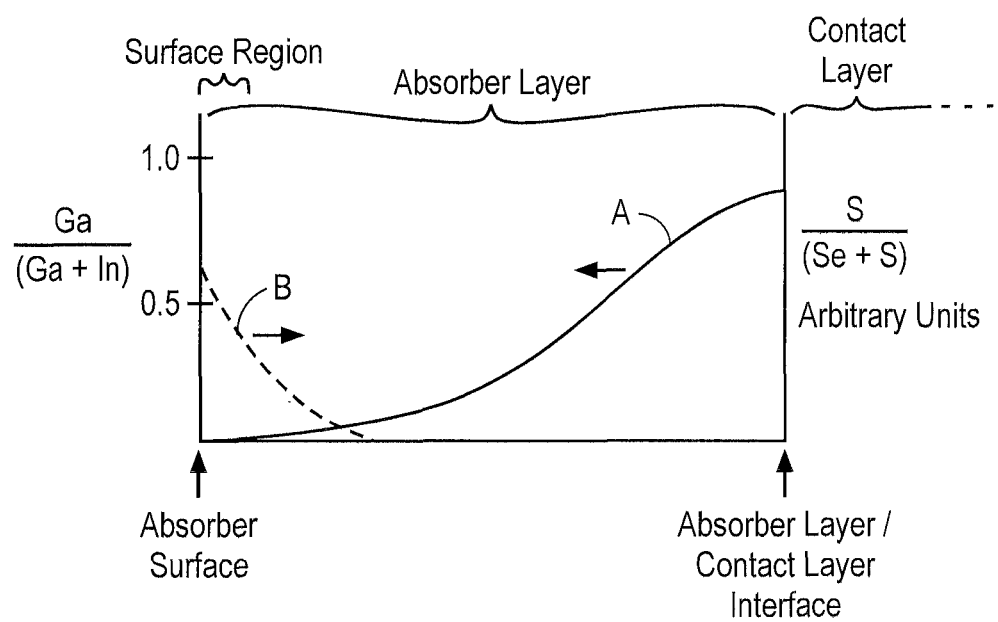
FIG. 2 is a graph showing the Ga/(Ga+In) molar ratio (Curve A) in a typical prior art CIGS absorber layer grown by selenization of a metallic precursor including Cu, In and Ga, wherein when CIGS layer is sulfidized at high temperature, a S profile (Curve B) is obtained at the surface region increasing the bandgap value at that location.

As pointed out earlier, reaction of Cu, In and Se to form $CuInSe_2$ may start at around 300° C., and therefore this reaction is favorable compared to the reaction of Ga species which takes place at higher temperatures typically above 500° C. In other words if a metallic precursor layer containing Cu, In, and Ga is reacted with Se by increasing the temperature from room temperature to 550° C. at a slow rate, as the precursor is heated up to around 300° C. and beyond, Cu and In within the metallic precursor would start forming $CuInSe_2$ because both Cu and In would easily diffuse to the surface and react with Se. As an example, let us assume that a heating rate of 5° C./sec is employed during a reaction process. This means that it would take (550–300)/5=50 seconds for the temperature of the precursor to go from 300° C. to 550° C. During this long period a large percentage of the In within the metallic precursor is expected to react with Cu and Se to form a surface layer which is rich in In such as shown in FIG. 2, Curve A. This would be true even if the precursor layer comprises a Ga-rich or pure Ga surface, such as a Cu/In/Ga precursor stack deposited in that order over a base including a substrate and a contact layer. Since reaction of Ga species takes place at higher temperatures (typically higher than 500° C.), it is important to increase the rate of temperature rise, especially beyond 300° C. Use of a temperature rise rate of 10° C./sec would reduce the reaction time before the formation of Ga-rich phase to about 25 seconds. For the special precursor structure of the present invention this may be adequate since Ga is confined or sandwiched between two Group VIA-rich layers (the second portion 32B and the fourth portion 32D), however, the temperature rise rate for temperatures in the range of 300-600° C. is preferably higher than 20° C./sec, more preferably higher than 30° C./sec, most preferably higher than about 50° C./sec. For a rate of 50° C./sec, the temperature of the precursor is expected to go from 300° C. to 550° C. in 5 seconds. This would help the Ga species reaction kinetics to catch up with that of In species since the temperature goes above 500° C. in 4 seconds and Ga species can also start reacting along with In species. The special structure of the precursor layer 32 of the present invention also increases the residence time of Ga species near the surface and helps provide an absorber layer with increased Ga content at its surface.

Figure 4:
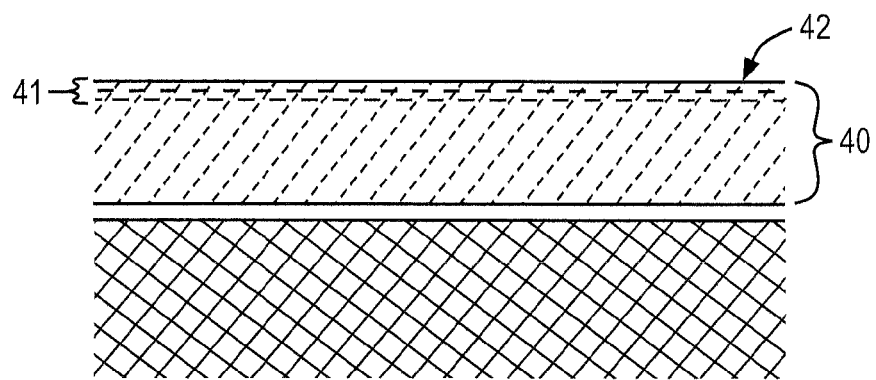
FIG. 4 is a compound CIGS absorber layer formed using the precursor layer depicted in FIG. 3.

FIG. 4 shows an exemplary CIGS absorber layer 40 formed by heating the structure 35 of FIG. 3 to a temperature above 500° C. in an inert atmosphere or in an atmosphere containing Se. The heating rate for the temperature range between 300° C. and the highest temperature (which may be in the 550-600° C. range) is preferably higher than 20° C./sec, more preferably higher than 30° C./sec, most preferably higher than 50° C./sec. As can be seen from this figure the CIGS absorber layer 40 comprises a surface region 41, wherein the surface region 41 comprises a Ga/(Ga+In) ratio in the range of 0.1-0.3. The thickness of the surface region 41 is in the range of 0.1-0.5 um, preferably in the range of 0.1-0.3 um, whereas the total thickness of the CIGS absorber layer 40 may be 0.8-3.0 um, preferably 1-2 um. Below the surface region 41, the Ga/(Ga+In) ratio within the bulk of the absorber layer 40 depends on the composition of the first portion 32A of the precursor layer 32. Depending upon the Ga content of the first portion 32A, The Ga/(Ga+In) ratio within the bulk of the absorber may change between 0 and 0.8, preferably between 0.1 and 0.6.

In a particular embodiment the distribution of Ga in the CIGS absorber layer formed after the reaction step may be controlled by changing the relative thicknesses of the second portion 32B, the third portion 32C and the fourth portion 32D, as well as the composition of the first portion 32A of the precursor structure shown in FIG. 3. Such Ga distribution control has always been possible for the co-evaporation techniques used for CIGS film formation. However, as shown in FIG. 2, the two-stage processes of the prior art studies have yielded Ga distribution represented by the Curve A.

As described before, the precursor structure 32 of FIG. 3 may yield a CIGS absorber layer with a surface-region-Ga-content in the range of 10-30% molar. Distribution of Ga through the rest of the thickness of such CIGS layers may be controlled to achieve the different Ga/(Ga+In) molar ratio distributions or profiles, with four specific distributions shown in FIG. 5A and labeled as Curves X, Y, Z and W. As is apparent from the discussions above, the Ga/(Ga+In) profile shown by Curve X may be obtained by reacting a precursor layer 32 comprising a first portion 32A containing only Cu and In for the precursor structure of FIG. 3. In this case, Ga is provided only from the third portion 32C, near the surface, and therefore the resulting CIGS absorber layer has a Ga-rich surface and the Ga content decreases towards the contact layer. As the Ga content of the first portion 32A is increased more and more, the Ga/(Ga+In) distribution curves of Y, Z and W may be obtained. For example, a precursor layer wherein the first portion 32A has a Ga/(Ga+In) molar ratio between 10-20% will yield a CIGS absorber layer with a Ga/(Ga+In) distribution or profile similar to Curve Y. A Ga/(Ga+In) molar ratio in the range of 20-40% in the first portion 32A will yield a Ga/(Ga+In) distribution similar to that of Curve Z, whereas a Ga/(Ga+In) molar ratio in the range of 40-60% in the first portion 32A will yield a Ga/(Ga+In) distribution similar to that of Curve W. All the Ga/(Ga+In) profiles of FIG. 5A may provide a Ga/(Ga+In) molar ratio in the range of 10-30% at the surface region, i.e. the top 100-300 nm region of the CIGS absorber layer, and as discussed previously, this is important to obtain high voltage values from the solar cells fabricated on such absorber layers.

CIGS is a compound material group with high optical absorption coefficients in the visible and near-infrared (IR) region of the solar spectra, especially between the wavelengths of about 0.5 μm and 1 μm. Consequently, most of the visible solar spectrum is absorbed in about the first 0.5 μm thick region (high absorption region) near the surface of a CIGS solar cell. The light absorbed within the high absorption region contributes the most (e.g. over 80%) to the light generated current of a solar cell fabricated on a CIGS absorber layer. The high absorption region is shown in FIG. 5A as the region "L" near the surface of the CIGS layer.

Figure 5A:
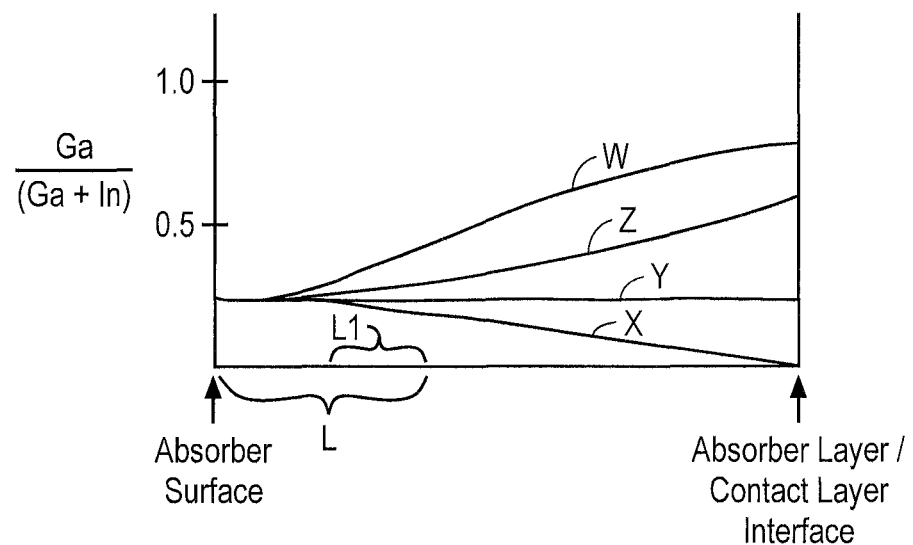
FIG. 5A shows four different Ga/(Ga+In) molar ratio profiles or distributions that can be obtained in CIGS absorber layers.

The exemplary Ga/(Ga+In) profiles of FIG. 5A suggest a Ga/(Ga+In) molar ratio of about 0.25 or higher within most of the high absorption region "L". This Ga content corresponds to a bandgap value of about 1.2 eV and higher. The Ga distribution shown by Curve X suggests a CIGS bandgap that gets smaller towards the back contact of the device, eventually reaching a value of about 1 eV, which is the bandgap value of CIS. Lower bandgap CIGS type materials have the capability to generate higher currents because they can absorb higher wavelength photons. However, for this higher current to be collected, it needs to be generated within the high absorption region, and near the absorber surface. A Ga distribution such as the one shown in Curve X in FIG. 5A has the lower bandgap material away from the absorber surface, in a section labeled as "L1". In this section "L1" the bandgap grading is such that it creates an electric field that pushes the light generated electrons towards the contact layer instead of towards the surface where the junction is in a CIGS solar cell. This does not allow good collection of electrons since only the electrons reaching the junction at the absorber surface are collected as light generated current.

Figure 5B:
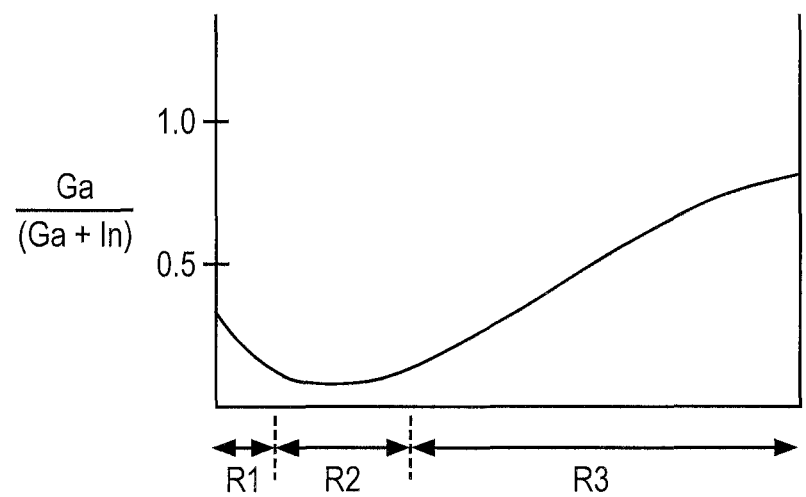
FIG. 5B shows a Ga/(Ga+In) molar ratio distribution within a CIGS absorber layer that yields high efficiency solar cells.

It has been determined that the Ga/(Ga+In) profile shown in FIG. 5B is more desirable for a CIGS solar cell than the various profiles shown in FIG. 5A. Since the bandgap of CIGS increases as its Ga content increases, and the bandgap value decreases as the Ga content decreases, the Ga profile shown in FIG. 5B may also be viewed as the bandgap profile in the absorber layer. Accordingly, referring back to FIG. 5B, there is a Ga/(Ga+In) molar ratio of 0.1-0.3 near the surface of the absorber (region R1 or the surface region). The molar ratio goes down towards zero in region R2 (the transition region) and then rises up again towards the back contact in region R3 or the bulk region. The moderately high Ga concentration in region R1 provides the high voltage (>600 mV) for the solar cell. Lower Ga concentration (and therefore smaller bandgap in the range of 1-1.1 eV) in region R2 provides the high current, and the increasing high Ga content in region R3 provides an electric field that pushes the generated electrons towards the absorber surface. With a bandgap grading profile such as the one shown in FIG. 5B, CIGS solar cells with efficiencies in the range of 16-20% can be fabricated. Exemplary thicknesses of the regions R1, R2 and R3 may be in the ranges of 50-200 nm, 100-200 nm and 500-1500 nm, respectively.

Figure 6:
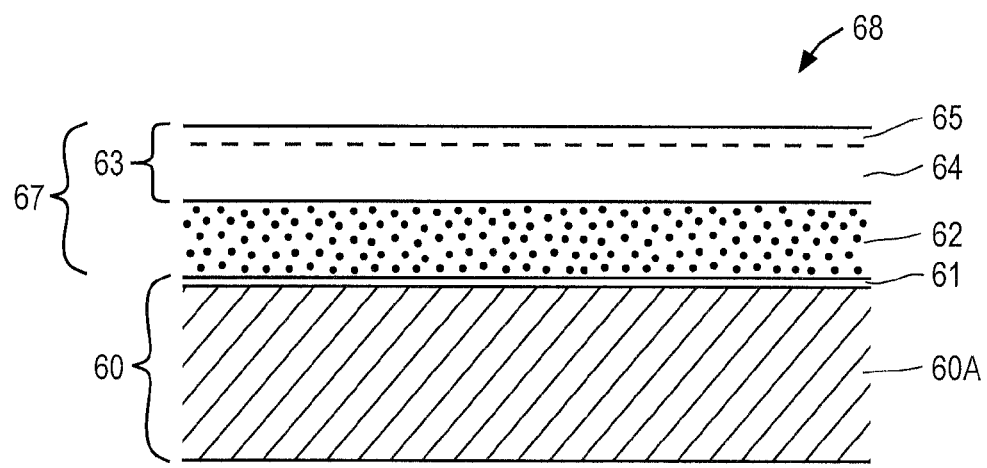
FIG. 6 shows a precursor layer employed to form the Ga/(Ga+In) molar ratio distribution shown in FIG. 5B.

A CIGS absorber layer with the Ga distribution profile such as the one shown in FIG. 5B may be obtained by a two-stage process employing a specially designed precursor layer, now described with reference to FIG. 6. The precursor layer 67 of FIG. 6 may be formed on the base 60 using the various thin film techniques such as evaporation, sputtering, ink deposition and electrodeposition, etc. The base 60 preferably includes a substrate 60A and a contact layer 61. The precursor layer 67 comprises a first sub-layer 62 and a second sub-layer 63, which is formed over the first sub-layer 62. The first sub-layer 62 comprises Cu, In and Ga, substantially in their metallic forms, in amounts that yield a Cu1/(In1+Ga1) molar ratio in the range of 0.8-1.10, wherein Cu1, In1 and Ga1 refer to the molar amounts of Cu, In and Ga in the first sublayer 62. The second sub-layer 63 comprises Ga and Se, substantially in their elemental form, i.e. they are not reacted to form Ga-selenide compounds. The molar amount of Ga in the second sub-layer 63 (Ga2) is such that the molar ratio Cu1/(In1++Ga1+Ga2) is in the range of 0.7-1.0, preferably in the range of 0.7-0.9. Furthermore, the amount of Se in the second sub-layer is such that it is adequate to form CIGS when reacted with all the Cu, In and Ga in the precursor layer 67, i.e. the number of moles of Se should be at least twice the total number of moles of Cu, or at least two times Cu1.

Figure 6A:
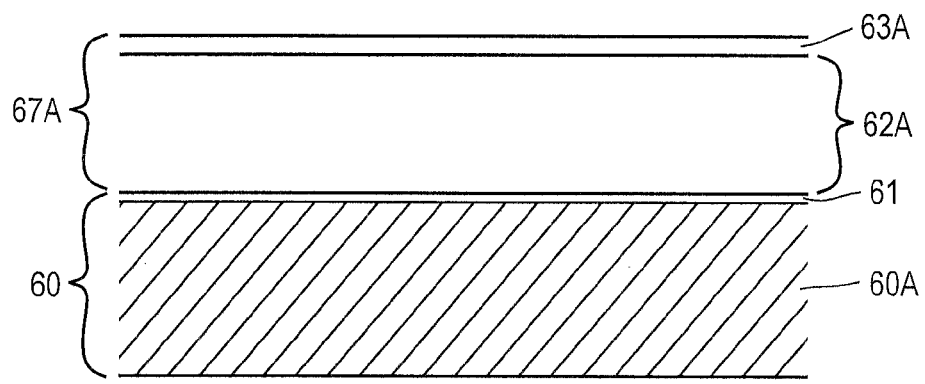
FIG. 6A shows a partially reacted precursor layer on a base obtained by partially reacting the precursor layer of FIG. 6.

In a preferred embodiment, the second sub-layer 63 comprises a first film 64 and a second film 65. The first film 64 comprises elemental Se and the second film 65 comprises elemental Ga. Preferably the first film 64 is a film of Se and the second film 65 is a film of Ga. During reaction of such a precursor layer, as the temperature of the structure 68 is raised beyond 220° C., which is the approximate melting point of Se, the Se of the first film 64 starts to react with the Cu and In of the first sub-layer 62 since the first film 64 is in intimate contact with the first sub-layer 62. During this first time period when the temperature is in the first range of 220-500° C., preferably 220-450° C., reactions between Cu, In and Se dominate compared to the reactions involving Ga, as described before. Therefore, during the first period as the Se in the second sub-layer 63 diffuses into and reacts with the first sub-layer 62, the Ga within the second sub-layer 63 stays within the second sub-layer 63 which keeps getting thinner and thinner and more and more Ga-rich as Se gets consumed by the reaction with the first sub-layer 62. FIG. 6A shows a status of the partially reacted precursor layer 67A at the end of a first time period during which the precursor layer 67 of FIG. 6 is subjected to a temperature in the first preferred range of 220-450° C. The first time period may be in the range of 0.5-5 minutes depending upon the highest temperature reached. Preferably, to cause the reaction of Se from the second sub-layer 63 with the first sub-layer 62 the temperature can be raised from about room temperature to about 450° C. continuously at a rate of 5-20° C./sec during the first time period and then the temperature can be kept at the first temperature range. The partially reacted precursor layer 67A comprises two sections, a bottom section 62A and a top section 63A. The bottom section 62A comprises selenized Cu and In species, such as Cu—Se (copper selenide), In—Se (indium selenide) and CIS species as well as inter-metallic species comprising Ga, such as Cu—In—Ga inter-metallics, for example $Cu_{11}(In,Ga)_9$. Selenide species are preferably close to the top surface of the bottom section 62A and the Ga containing phases originating from the Ga1 in the first sub-layer may be closer to the contact layer 61. In other words, a Ga distribution profile such as the one shown by Curve A of FIG. 2 can form within the bottom section 62A during this first time period. The top section 63A comprises still the Ga and the unreacted remaining Se, the Ga originating from the second sub-layer 64, i.e. Ga2. During a second time period, which may be 0.5-10 minutes long, the temperature is raised to a second temperature range, which preferably is 500-575° C. or above. Once the temperature goes to and beyond 500° C., reactions of Se, Cu selenide, In selenide and CIS with Ga become appreciable. Consequently, at the end of the second time period, a CIGS compound layer is formed. In this CIGS compound layer, a Ga profile with the Ga1 in the first sub-layer segregated towards the contact layer is formed. This is equivalent to the region R3 of FIG. 5B. The Ga provided from the top section 63A (Ga2) reacts with the Cu—Se, In—Se and CIS species formed during the first time period near the top surface of the first section 62A. As a result, a surface region of CIGS layer similar to the region R1 of FIG. 5B is formed. The region R2 between the region R1 and region R3 stays as a Ga-poor region. As an example, a first sub-layer may be formed with a Cu/(In+Ga) ratio in the range of 0.8-1.1 and a Ga/(Ga+In) molar ratio of about 0.4. The first sub-layer may comprise about 150 nm thick Cu, 100-120 nm thick Ga and 250-270 nm thick In. A 900-1000 nm thick Se layer may then be coated on the first sub-layer. A Ga film may then be deposited on the Se layer. The Ga film may have a thickness in the range of 10-50 nm. The precursor layer thus prepared may be heated up to 550° C. and reacted for about 5 minutes to form a graded bandgap CIGS film with the Ga profile or grading similar to the shown in FIG. 5B.

It should be noted that the second sub-layer may additionally comprise a Group IB material such as Cu and/or Ag in its metallic form (i.e. not reacted with Se). For example, the second sub-layer may have a layer of Se and a layer of metal coated on the layer of Se, whereas the layer of metal may comprise both Cu and Ga or both Ag and Ga. If the layer of metal comprises both Cu and Ga, for example, when the precursor is heated, for temperatures below 500° C., a Cu—Ga inter-metallic may form over the Se layer. This inter-metallic does not readily react with Se until the temperature exceeds 500° C., at which time it releases Ga to be included at the surface of the forming CIGS film thus forming a Ga profile similar to the one shown in FIG. 5B.

Solar cells may be fabricated on the CIGS absorber layers of the present inventions using materials and methods well known in the field. For example a thin (<0.1 microns) buffer layer such as a CdS layer may be deposited on the surface of the absorber layer using techniques such as the chemical bath deposition (CBD) method. A transparent window of a transparent conductive oxide (TCO) such as ZnO may be deposited over the CdS layer using MOCVD or sputtering techniques. A metallic finger pattern is optionally deposited over the TCO layer to complete the solar cell.

Although the present invention is described with respect to certain preferred embodiments, modifications thereto will be apparent to those skilled in the art.

What is claimed is:

1. A process of forming a $Cu(In,Ga)Se_2$ film on a base, the process comprising:
    depositing a precursor structure on the base, the precursor structure comprising a first sub-layer formed on the base and a second sub-layer formed on the first sub-layer; and
    reacting the first sub-layer and the second sub-layer with each other by increasing the temperature of the precursor structure to a first temperature range for a first time period and then to a second temperature that is higher than the first temperature range for a second time period to form the $Cu(In,Ga)Se_2$ film on the base, wherein;
    the first sub-layer is substantially metallic and comprises Cu, In and Ga,
    the second sub-layer comprises a layer of Se formed directly on and in contact with the first sub-layer and a layer of Ga formed directly on in contact with the layer of Se; and,
    wherein the first temperature range is 220-450° C. and the second temperature is at least 500° C., and wherein the step of reacting forms the $Cu(In,Ga)Se_2$ film to include a surface region, a bulk region and a transition region between the surface region and the bulk region, wherein a transition region Ga/(Ga+In) molar ratio in the transition region is lower than a surface region Ga/(Ga+In) ratio in the surface region and a bulk region Ga/(Ga+In) molar ratio in the bulk region.

2. The process of claim 1, wherein a Ga/(In+Ga) molar ratio in the first sub-layer of the precursor structure is in the range of 0.2-0.5 and a Cu/(In+Ga) molar ratio of the precursor structure is in the range of 0.7-1.0.

3. The process of claim 2, wherein the first time period is about 0.5-5 minutes and the second time period is about 0.5-10 minutes.

4. The process of claim 2, wherein a thickness of the layer of Ga in the second sub-layer is in the range of 10-50 nm.

* * * * *